(12) United States Patent
Eckert et al.

(10) Patent No.: US 6,341,093 B1
(45) Date of Patent: Jan. 22, 2002

(54) SOI ARRAY SENSE AND WRITE MARGIN QUALIFICATION

(75) Inventors: Martin Eckert, Jettingen; Guenter Mayer; Juergen Pille, both of Stuttgart; Dieter Wendel, Schoenaich, all of (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/872,885

(22) Filed: Jun. 1, 2001

(30) Foreign Application Priority Data

Jun. 7, 2000 (EP) .............................................. 00112222

(51) Int. Cl.[7] .............................................. G11C 29/00
(52) U.S. Cl. ...................... 365/201; 365/194; 365/191; 365/233; 365/233.5; 365/156
(58) Field of Search ................................ 365/201, 156, 365/154, 191, 194, 233, 233.5

(56) References Cited

U.S. PATENT DOCUMENTS

| | | | | |
|---|---|---|---|---|
| 6,005,813 A | * | 12/1999 | Waller et al. | 365/200 |
| 6,055,209 A | * | 4/2000 | Abo | 365/233 |
| 6,064,601 A | * | 5/2000 | Yoo et al. | 365/189.04 |

* cited by examiner

*Primary Examiner*—Andrew Q. Tran
(74) *Attorney, Agent, or Firm*—Daryl K. Neff

(57) ABSTRACT

The present invention relates to storage devices and in particular, it relates to a method for testing the storage quality of history dependent memory array cells. A cell can be stressed selectively with predetermined test conditions such that these test conditions cover all of the hardware status distribution which might arise when the cell is operated under the full range of operating conditions. This is basically achieved by cutting off a predetermined cutoff width of the trailing edge of the active wordline select pulse.

13 Claims, 5 Drawing Sheets prior art 6-device storage cell
BLT/BLC: bitline true/complement, WL: wordline
Q1/Q2: cell pass-device Silicon On Insulator
CMOS Bulk Silicon
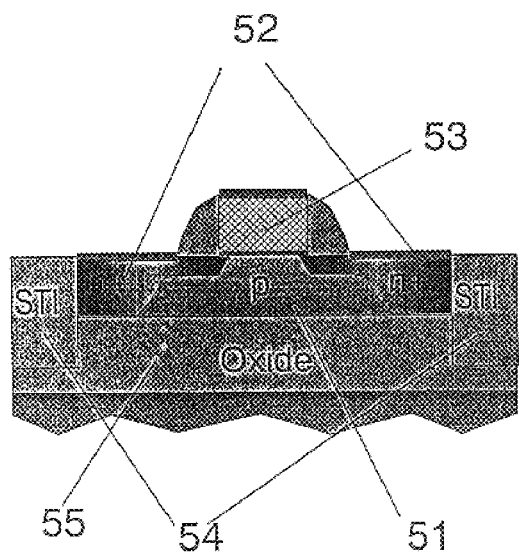
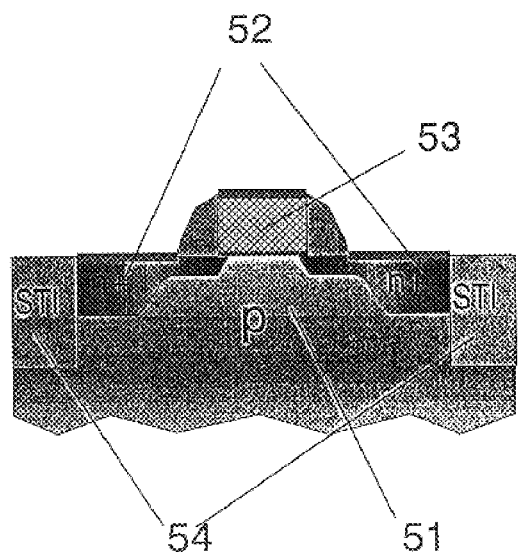
FIG. 5

SOI ARRAY SENSE AND WRITE MARGIN QUALIFICATION

FIELD OF THE INVENTION

The present invention relates to storage devices and in particular, it relates to a testing method and system for testing the storage quality of history dependent memory array cells, namely arrays built in SOI technology.

BACKGROUND OF THE INVENTION

Conventional CMOS SRAM arrays, commonly used as cache memories in computer processor devices, comprise memory cells which are basically structured as depicted in FIG. 1.

The cell comprises a cross-coupled pair of transistors N1/P1 having reference signs 1, 2 and N2/P2, having reference signs 3, 4, respectively. A differential sensing scheme (not explicitly depicted) is used with a complementary dual rail bitline and a sense amplifier circuit sensing the voltage difference between the two bitlines 12, 14, BLT for true, and BLC for complement, see for reference and more detail: Correale et al., "Circuit Technique for Optimizing Access Time in Static Random Access Memories", Technical Disclosure Bulletin volume 38 n5 05–95 pp. 483–488.

A large number, up to 1024, of such cells, as one of them is shown in FIG. 1, are connected to the wires BLT 12, BLC 14.

This structure is often referred to as one bitline. Both bitlines—connections 12, 14—are pre-charged to the supply voltage Vdd prior to read or write. In a read case one cell is selected via the wordline select signal WL, and as a result one of the bitline-connections BLT or BLC is then discharged through the pass devices Q1, or Q2—having reference signs 5, and 6—of the selected cell, respectively, according to the data stored in the cell. The cell is as small as possible to increase storage density, and therefore the current drawn from the bitline-connection through the cell is limited. The capacitance of the bitline-connection BLT and BLC is determined mainly by the sum of the capacitance of the cell transfer devices connected to one bitline-connection plus the wire-capacitance of the connection.

In order to speed up the data access a sense amplifier circuit senses the voltage difference between the two bitlines 12, 14 beginning at a time usually 'long' before one of the bitlines 12, 14 is fully discharged.

In CMOS based memories a quite small bitline voltage difference, in the range of $\frac{1}{10}$ of Vdd would be sufficient to guarantee the proper function in this fully symmetric system. Several parasitic effects, however, cause asymmetries in the cell, as e.g., differences in device properties caused by different channel length, threshold voltages of the involved transistor devices, etc. Especially the pass devices Q1 and Q2 influence the discharge of the true and complements bitlines 12, 14, respectively. Coupling onto the bitlines changes the voltage differences and device properties in the sense amplifier, causing the circuit to preferably switch into one data level, e.g. logic level "0". Thus, a certain minimum voltage difference is needed for secure reading the cell content.

In a SOI technology basically the same logical cell construction is used. The device properties of SOI-CMOS devices, however, are different from conventional bulk CMOS devices.

Thus, additional effects cause asymmetries and device performance degradation: device properties change dependent on their switching history due to the so-called body effect influencing the threshold voltages of involved transistors.

The total bitline capacitance depends on the data stored in the cells connected to the bitline because the body voltage of the cell pass devices depends on the stored data and influences the bitline loading. Further, parasitic bipolar currents slow down the discharge of the bitline, and repeated reading of a cell results in local heating as the silicon oxide to the side and the bottom thermally isolates the device. Thus, when the same reading scheme is applied as used in bulk CMOS technology the voltage difference at the sense point of the sense amplifier must compensate for all of these additional effects to guarantee the proper function of the array under operational conditions.

Prior art bulk CMOS based array hardware test methods do not have to deal with history dependent behavior. So called margins are tested and verified by extending the test conditions over the guaranteed specification. Voltage and temperature range during test is extended, access and cycle time verification is tightened. Patterns are applied which stress the neighborhood of the selected cell with respect to leakages and coupling. Such prior art array testing methods for bulk-CMOS devices are not sufficient when being applied to SOI arrays because SOI specific effects are pattern and history dependent.

The time constants of this history and pattern dependent memory effects, which alter the device properties, are in the millisecond timeframe while cycle times of modern arrays are in the nano seconds. Therefore thousands of cycles would be necessary to bring a circuit into a specific state for testing one cell which would result in an unacceptable amount of test time for a complete array with thousands or even millions of cells.

It is thus an object of the present invention to provide a reliable test method for memory arrays based on history dependent hardware, for example hardware based on SOI technology. A further objective is to implement a test facility into a SOI array memory device.

SUMMARY OF THE INVENTION

The present invention is based on the knowledge that the duration, i.e. the pulse width of the active-state of the wordline select signal, causes the voltage difference needed for evaluating the bit content when reading from the cell. More precisely, during the active state period of time the voltage difference develops in a range between the nominal voltage level for logic "0" and a full rail swing, dependent on the duration of the wordline select signal. The higher the voltage difference the more securely a bit can be read from the cell. A manipulation of the signal duration can thus be exploited for simulating rare hardware status situations in which a bit value can be read based on the history experienced during test, but the read attempt would fail with a different history, not applied during test. In the case of a write operation, the wordline select signal duration determines the time within which the cell has to flip into the state to be written to the cell. If the cell fails to switch during the time the pass devices are opened, the internal nodes fail to be overwritten with the state applied via the bitlines BLT, BLC. Thus, the cell remains in the prior state and the write function fails.

The manipulation of the wordline select signal duration, i.e. its pulse width, can now be performed basically in two different ways: first, a minimum pulse width can be found out experimentally for a given hardware which is used for testing the hardware and defines the minimum safety margin to be guaranteed by the hardware manufacturer. Then, the test may be performed at the client side with only two possible results: the hardware fulfills the quality requirements or not. Second, the pulse width can be varied systematically covering a range of pulse widths. In this case a hardware can be qualified in fine degrees which can be useful for exploring physical effects as described below.

In this way the array can be stressed selectively with predetermined test conditions which represent a read or write margin, respectively, which are able to be dimensioned such that these test conditions cover all of the hardware status distribution which might arise when the cell is operated under application conditions at the client site.

The basic idea way to achieve this is to control the sense signal developing time via the pulse width of the wordline select signal and thereby the time the cell is connected via the pass-devices to the bitline so that a voltage difference can develop on the bitlines. More particularly, shortening the pulse width is achieved by cutting off a predetermined cutoff width of the trailing edge of the pulse signal for generating a shortened test pulse width which is short enough for detecting hardware defects which are effective only in a specific history dependent status of a memory cell.

As the wordline select signal is used both, for writing into and reading from the cell the inventive concept can be applied for both read and write. This is a remarkable advantage of the present invention. During a write operation the sense amplifier is not used. The cell is written directly during the time period the cell is selected by the wordline select signal. Reducing the wordline width thus detects asymmetries and defects in the write scheme, which prevent successful writing of the cell in a specific, history dependent case.

With this measure the required stress conditions can be realized during testing which allow for guaranteeing a certain performance of the cell in the application environment.

As a further option, the cutoff width can be comfortably adjusted to the actual situation given by the hardware to be tested, because the safety margins mentioned above vary dependent on one several factors, amongst others of the array size, for example.

Advantageously, the timing scheme remains unchanged compared to conventional design, i.e., the wordline signal starts the bitline discharge, the SSA signal activates the sense amplifier. An additional logic now controls the wordline signal duration by cutting off the trailing edge. The leading edges of the different select signals remain ungated, and therefore, the proposed scheme has no impact on the performance of the array.

In a further implementation the proposed invention provides a new test scheme for read and write margin test of SRAM array macros with a time resolution limited by the tester. It can be used to measure SOI specific effects with high resolution accuracy. With this implementation the present invention proposes a new built-in test feature controlling the sense voltage in time increments limited by the test machine which allows high resolution test and also allows for reducing the sense signal down to almost zero volts. Controlling is possible externally by the test machine or internally using a built-in delay unit.

BRIEF DESCRIPTION OF THE DRAWINGS

The present invention is illustrated by way of example and is not limited by the shape of the figures of the accompanying drawings in which:

FIG. 5 is a schematic representation comparing the and CMOS bulk transistor technology.

DETAILED DESCRIPTION OF THE PREFERRED EMBODIMENTS

Figure 1:
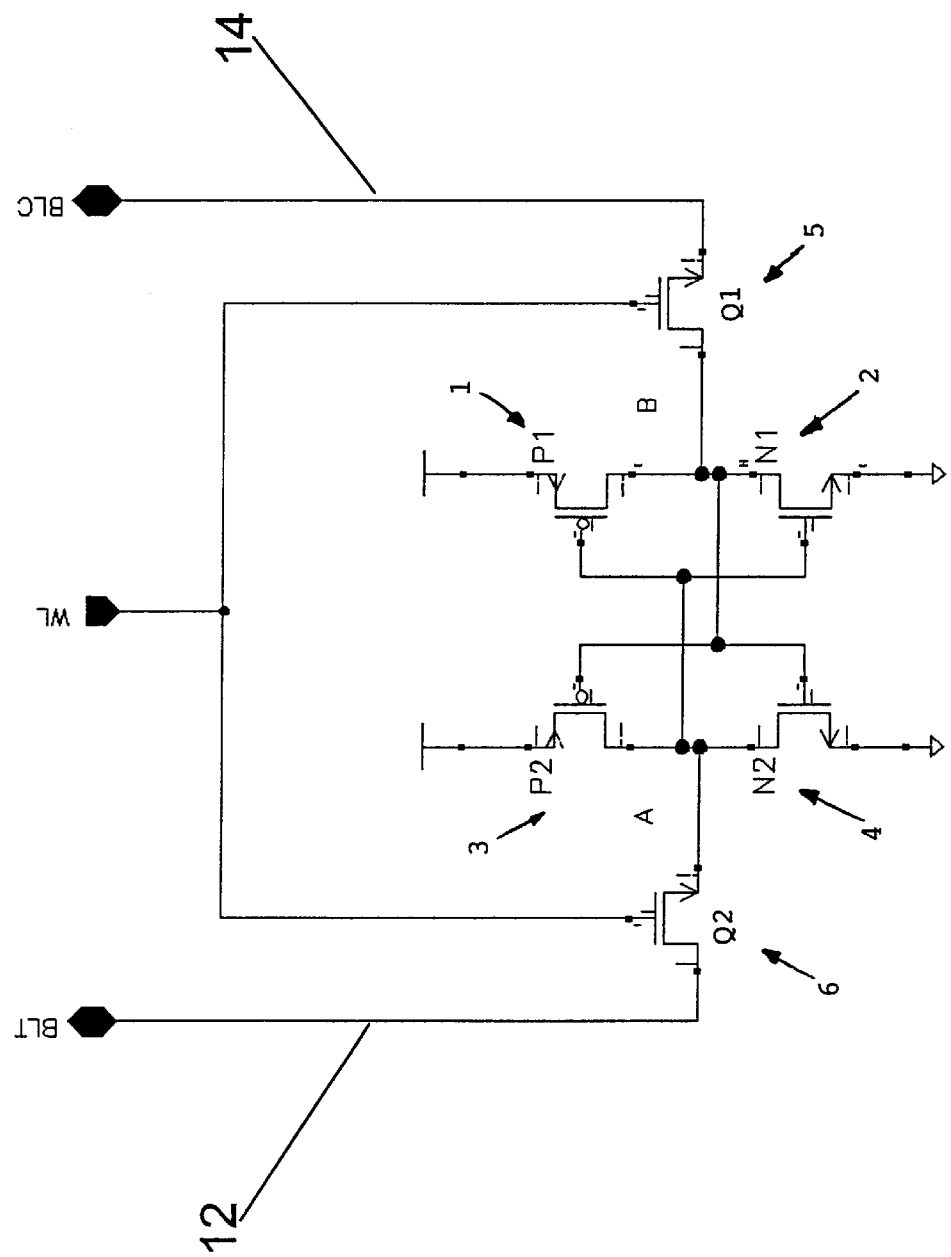
FIG. 1 is a schematic block diagram showing a prior art standard six device storage cell.

With reference to FIG. 5 an n-FET is chosen to describe the specific SOI-device characteristics necessary for a deeper understanding of the peculiarities of the present invention, since this device type influences the cell performance most. But the description is also applicable to a p-FET with inverted polarities and conductivity types.

Starting from existing CMOS bulk technology (right hand portion of FIG. 5) the region under the gate of a CMOS device is also called the body 51 of the device. Source and drain 52 are n-type diffusions and are separated by the p-type body. A positive voltage on the gate 53 converts the p-type silicon thereunder to n-type and forms a thin channel between source and drain, thus a current can flow between source and drain.

Adjacent devices are separated by a trench oxide (STI—silicon trench isolation) 54 to increase density and prevent latch-up effects.

The performance of a CMOS circuit mainly depends on the maximum current of the device and the total capacitance it has to charge. The current is a complex function of many technology characteristics, but as a first approximation the channel length and the threshold voltage $V_t$ are the key parameters. The channel length is defined as the distance between source and drain. The current increases with a smaller channel length. The threshold voltage is the voltage needed on the gate to build the channel. While the channel length is of a physical nature, $V_t$ is a function of many independent physical parameters like gate oxide thickness, doping concentrations and electrical conditions like the body voltage. A positive body voltage lowers the threshold so that the device can switch earlier and the maximum current is increased. The device is thus faster but also has a higher leakage.

In contrast to the CMOS bulk technology, the SOI technology (left hand portion of FIG. 5) gate 53, source and drain 52 are similar. SOI- technology, however, employs a layer 55 of silicon overlying an insulating material—usually silicon oxide as referenced in the drawing—on a supporting bulk wafer.

Thus, the active area now is in the top silicon layer on top of the buried oxide 55. This results in totally isolated devices, there is no longer any connection to the body through the backside of the wafer. The STI acts as a wall surrounding the devices, and the buried oxide is the isolating floor.

The body 1 of each device is floating. During current flow through the device impact ionization into the body charges up the body. The voltage level depends on the history of the device, i.e., how often it has switched and depends of the total capacitance it had to drive. The minimum is usually ground for an n-type device, the maximum is limited by the forward diode behavior of the source/drain diffusion and is in the order of a few hundred millivolts if Source or Drain are grounded but can go up to the supply voltage for a pass transistor with Source and Drain both on uplevel, see back to FIG. 1 the respective transfer device of the 6-device cell with the bitline being charged to Vdd and a '1 'stored at the respective internal cell node.

As already mentioned above the threshold voltage and the maximum current of a device are a function of the body voltage. A positive potential lets the device switch earlier because of the lower $V_t$ the current reaches the maximum value faster and the maximum is higher. While a current flows through the device, more charge leaks into the body. Because of impact ionization at the drain diode of the device, the potential increases and, in turn, also the current (kink effect).

Negative effects are the increased leakage currents due to the reduced $V_t$ and a parasitic bipolar n-p-n structure (source-body-drain). The bipolar transistor can be activated by a positive bias of the base (body) of the parasitic bipolar over source or drain, which act as emitter of the parasitic bipolar npn transistor, resulting in additional leakage.

Because the body potential now is a function of the device history, the behavior changes over time, and there is no longer a fixed drive current for a specific device, instead, it is only possible to assign a min/max value.

SOI also affects the device capacitance behavior. Wiring and device capacitance contribute to the total capacitance a device has to drive. The device caps are mainly the gate-to-body cap ($C_g$), the gate-to-source/drain overlap caps ($C_{gs}$, $C_{gd}$) and the source/drain-to-body diffusion caps ($C_s$, $C_d$). Since $C_g$, $C_s$ and $C_d$ are dependent on the body voltage, they vary with the history of the device.

Figure 2:
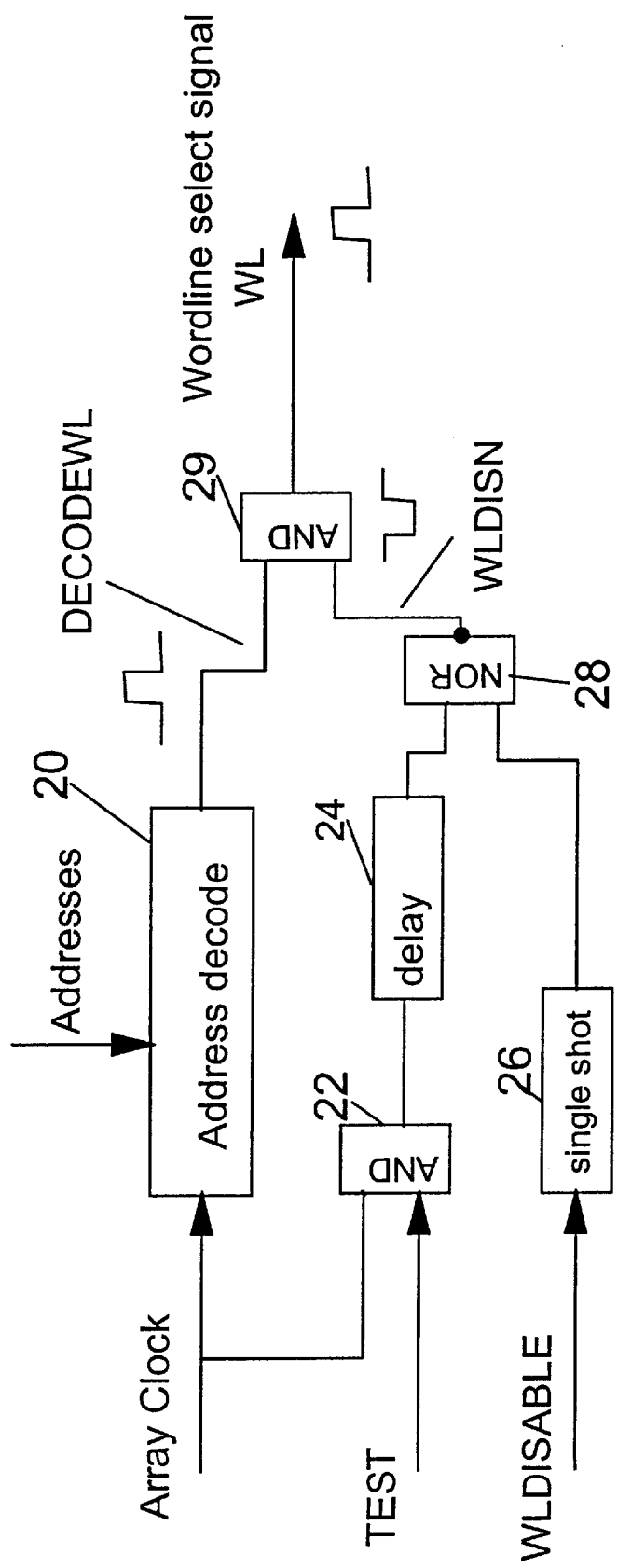
FIG. 2 is a schematic block diagram showing a preferred embodiment of a wordline signal duration control circuit according to the present invention.

With general reference to the figures and with special reference now to FIG. 2 an additional circuit is described which is used according to the present invention to shorten the wordline select signal duration by cutting off the trailing edge of it in order to generate a shortened test pulse width which is short enough to stress the cell in order to define a reasonable read/write margin.

Before entering the description of the circuit depicted in FIG. 2 it should be mentioned that the timing scheme underlying the test method according to the preferred embodiment of the present invention is the same as in conventional CMOS design, i.e., the wordline signal starts the bitline discharge, and the SSA signal activates the sense amplifier. An additional logic, however, now controls the wordline signal duration by cutting off its trailing edge. The additional logic circuit scheme is illustrated in FIG. 2.

The following abbreviations are used further herein:
WLDISABLE: is an external trigger signal,
WL: wordline with variable signal duration,
SSA: sense-amplifier enable signal,
ST/SC: true/complement output of the sense amplifier, respectively, connected to BLT, BLC, before the sense amplifier is enabled ,
sense voltage: voltage difference between ST/SC when SSA enables the sense amplifier,
A.CELL: true node of a storage cell,
B.CELL: complement node of storage cell,
A.CELL fail: write of a '1'into cell failed at short WL signal duration.

The logic circuit embodiment given in here is constructed as it reveals schematically from the switching scheme given in FIG. 2.

The array clock signal is fed into the address decode block 20 and into an AND gate 22 together with a test signal. The AND gate output is fed into a delay element 24. The WLDISABLE signal is fed through a single shot element 26, the output of which is NORED in a NOR gate 28 with the output of the delay element 24. Further, the output of the address decode block is fed together with the NOR 28 output into an AND gate 29. Its output is then used as the WL signal.

Next, the different kinds of operation modes of the circuit are described below.

In the normal operation mode, the TEST and WLDISABLE inputs are inactive. The array is selected via the ARRAY CLOCK. The WL (wordline) is selected via the address decoder block 20 which generates the DECODEWL signal and determines the signal duration of the WL in the mode.

In the test mode with fixed WL shortening, the TEST pin is active, and the WLDISABLE pin remains inactive. The WL is selected as described before. Enabled by the TEST signal the array clock is fed through a delay chain 24 and cuts off the WL signal via the signal WLDISN.

In the variable WL pulse shortening mode, the TEST pin is inactive and a pulse is applied to the WLDISABLE pin. An internal pulse with fixed width is generated via the single shot circuit 26 to be independent from slew and pulse width of the external applied signal WLDISABLE. This internal pulse cuts off the WL signal as it was previously described. Due to the use of the single shot pulse generation, the WLDISN signal and therefore the signal duration of the WL is only dependent of the relative time between the array clock's leading edge and WLDISABLE's leading edge.

Figure 3:
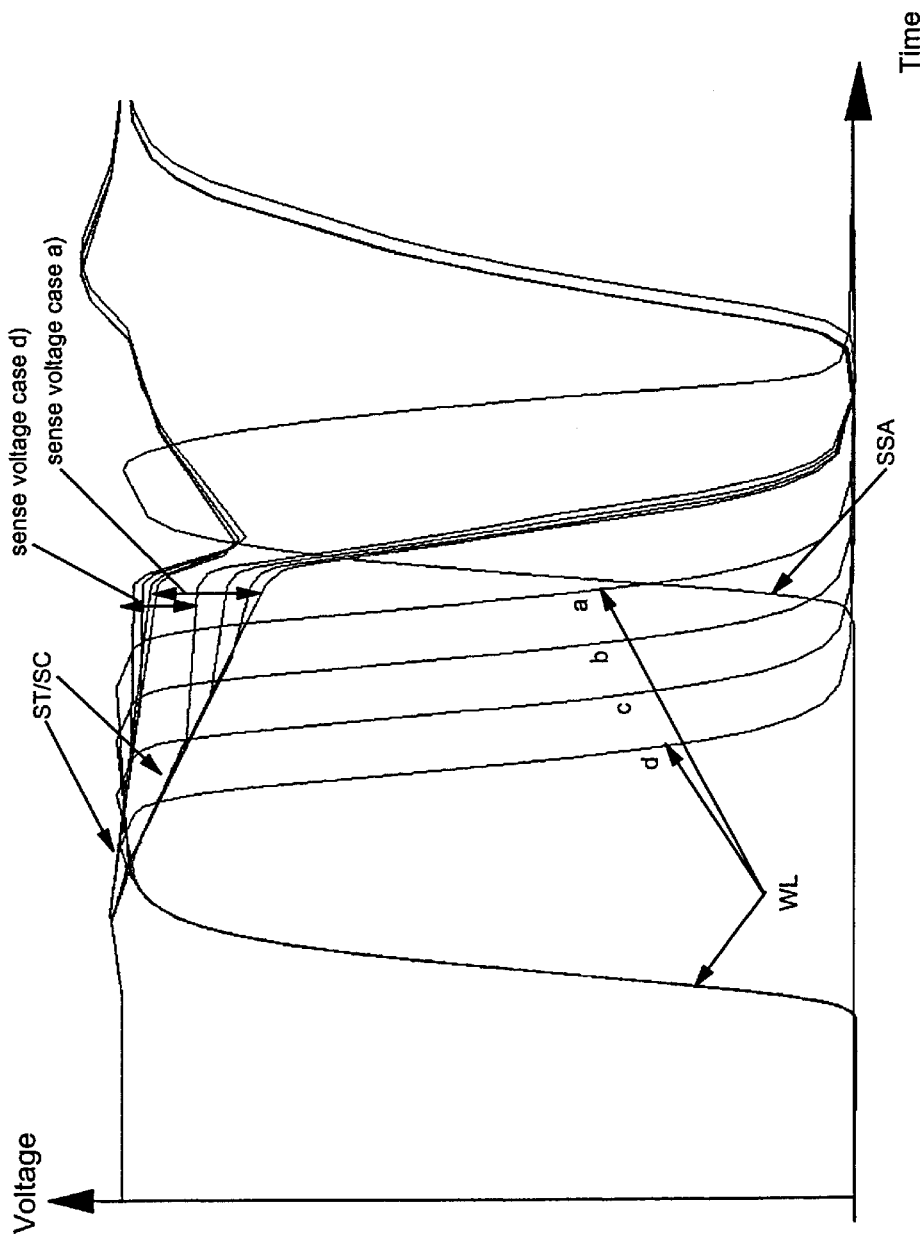
FIG. 3 is a schematic representation showing the time scheme during sensing with variable wordline signal duration.

FIG. 3 shows the time scheme during sensing with variable wordline signal duration. Four different wordline pulses, from a) for the widest to d) for the shortest are shown. All pulses start at the same time, as described before. Therefore, the rising edge of all variations is at an identical point in the timing scheme.

Reducing the wordline signal duration gives the cell less time for discharging the bitline and thereby controls the voltage difference at the sense point. This effect is illustrated with the range of sense voltage differences depicted in the drawing. Arrow case a) indicates a sense voltage difference of about 220 mV for the widest WL-pulse a). In the shortest case d) depicted the sense voltage difference drops down to about 140 mV. The wordline signal duration and the sense signal can be easily reduced down to zero in order to be able to establish a full range of test regimes.

Figure 4:
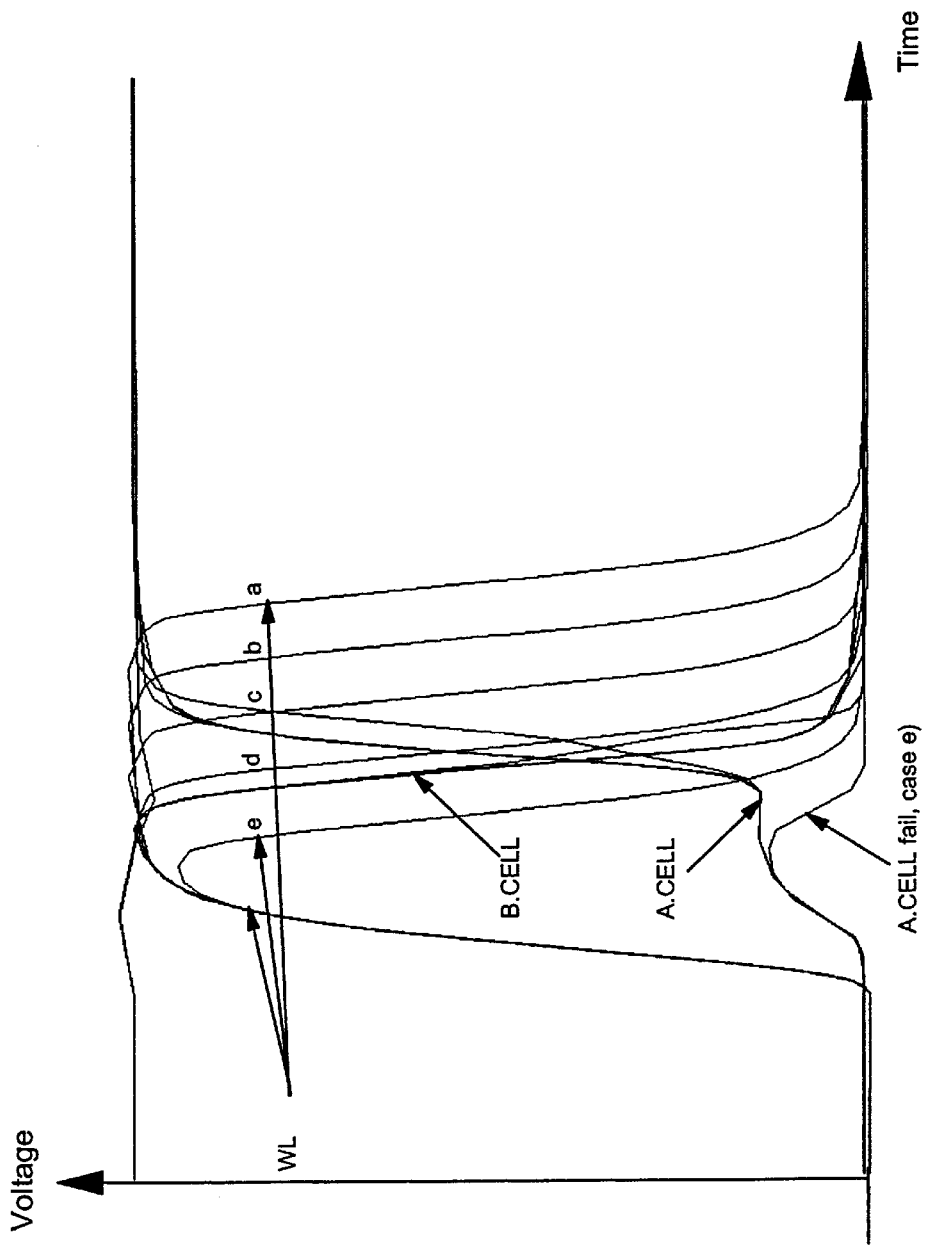
FIG. 4 is a schematic representation showing the time scheme during write with variable wordline signal duration.

FIG. 4 is a timing scheme during write with variable wordline signal durations in five cases, a, b, c, d, e. Both the true node and the complement node of a storage cell are shown.

During write the sense amplifier mentioned before in the read case is not used, and the cell is written directly during the time period in which the cell pass gate devices connect the bitline to the cell internal nodes A) and B), controlled by the wordline select signal.

A first group of curves showing a sharp rise from left to right belongs to the cell internal node A.cell, and represents the true node of the storage cell, whereas a second group of curves, denoted as B.cell, showing a sharp drop from left to right represents the complement node. The rise, or drop, respectively, when continued completely indicates a successful switching to the respective complementary new bit value compared to the state in which the cell was before.

As can be seen from the drawing the measure to reduce the wordline signal duration to the point where the cell does not switch anymore—see the arrow case e) for A.cell enables for detecting margins and asymmetries in the write scheme, again due to SOI specific effects. Thus, in the write case as well, reasonable margins can be established in order to build up a reliable test schema for memory arrays. The drawing shows the switching behavior of an ideal cell. Asymmetries and micro defects due to manufacturing will move the switching point, the point A.cell and B.cell cross, further to the right.

In the foregoing specification the invention has been described with reference to a specific exemplary embodiment thereof. It will, however, be evident that various modifications and changes may be made thereto without departing from the broader spirit and scope of the invention as set forth in the appended claims. The specification and drawings are accordingly to be regarded as illustrative rather than in a restrictive sense.

In particular, the cut-off width may be varied as required from array design, array size, the technology in use, the performance limits to be guaranteed, etc.

We claim:

1. A method for detecting hardware defects in a semiconductor memory, comprising:

generating a test wordline select signal having a first shortened duration relative to a normal wordline select signal used during normal read or write operations; and applying said test wordline select signal to memory array cells, said test wordline select signal permitting detection of a hardware defect dependent on a state history of a memory cell.

2. The method of claim 1 wherein said test wordline select signal is shortened from a trailing edge thereof.

3. The method of claim 1 wherein said test wordline select signal is applied during a read operation.

4. The method of claim 1 wherein said test wordline select signal is applied during a write operation.

5. The method of claim 1 wherein said semiconductor memory is fabricated in silicon-on insulator (SOI) technology.

6. The method according to claim 1 further comprising varying said test wordline select signal between a plurality of shortened durations including said first shortened duration and applying said varied duration test wordline select signal to determine performance of said memory cells.

7. An integrated circuit including a semiconductor memory, comprising:

a delay element receiving a clocked test signal to trigger shortening a duration of a wordline select signal relative to a normal wordline select signal; and means for providing said wordline select signal to said semiconductor memory.

8. The integrated circuit of claim 7 further comprising a single-shot circuit which generates a fixed width internal pulse, and a logic gate which receives output of said delay element and said internal pulse to trigger said shortening of signal duration.

9. The integrated circuit of claim 8 including a microprocessor.

10. A computer system including an integrated circuit of claim 8.

11. The integrated circuit of claim 7 wherein said duration is shortened from a trailing edge of said wordline select signal.

12. The integrated circuit of claim 7 including a microprocessor.

13. A computer system including an integrated circuit of claim 7.

* * * * *